United States Patent
Nakasuji

[11] Patent Number: 6,125,522
[45] Date of Patent: *Oct. 3, 2000

[54] MANUFACTURING METHOD FOR ELECTROSTATIC DEFLECTOR

[75] Inventor: Mamoru Nakasuji, Yokohama, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/748,191

[22] Filed: Nov. 12, 1996

[30] Foreign Application Priority Data

Nov. 15, 1995 [JP] Japan .................................... 7-296672

[51] Int. Cl.[7] .................................................. B23P 25/00
[52] U.S. Cl. .................................. 29/458; 29/874; 29/464
[58] Field of Search ............................ 29/467, 464, 559, 29/281.1, 281.5, 458, 885, 874; 250/396 R

[56] References Cited

U.S. PATENT DOCUMENTS

| | | | |
|---|---|---|---|
| 3,327,371 | 6/1967 | Kerns et al. | 29/467 X |
| 3,378,918 | 4/1968 | Closset | 29/464 X |
| 4,870,283 | 9/1989 | Taya | 250/396 R |
| 5,041,731 | 8/1991 | Oae et al. | 250/396 R X |
| 5,384,461 | 1/1995 | Jullien et al. | 250/396 R X |
| 5,598,625 | 2/1997 | Bluen et al. | 29/467 X |

*Primary Examiner*—S. Thomas Hughes
*Assistant Examiner*—Marc W. Butler
*Attorney, Agent, or Firm*—Klarquist Sparkman Campbell Leigh & Whinston, LLP

[57] ABSTRACT

Methods are disclosed for manufacturing an electrostatic deflector comprising multiple electrodes. The electrostatic deflector is of a type not tending to generate large eddy currents during use. The electrodes are arranged as electrode-members relative to each other in a desired angular relationship with high precision around an optical axis. Each electrode is formed by adhering a conductive film to portions of the surface of an insulative electrode-member material except an outer surface of the electrode-member, and a conductive film is adhered to at least some of the inner surface of an insulating outer casing. The electrode-members are inserted into respective grooves in a jig; then the outer surface of each electrode-member is attached to the inner surface of the outer casing. Lead wires can be attached to the electrodes, and the jig is removed by dissolution or melting.

16 Claims, 3 Drawing Sheets

MANUFACTURING METHOD FOR ELECTROSTATIC DEFLECTOR

FIELD OF THE INVENTION

This invention pertains to manufacturing methods for electrostatic deflectors used for high-speed and high-precision deflection of charged particle beams, e.g., electron beams or ion beams, and the like.

BACKGROUND OF THE INVENTION

Deflectors have a number of uses in devices that employ charged particle beams. For example, in scanning electron microscopes, deflectors are employed for the high-speed and high-precision scanning of an electron beam on a specimen. Deflectors are also used in charged particle beam transfer devices used, for example, in the reductive transfer, by electron beam, of a mask pattern onto a substrate surface (e.g., for transferring features, defined by a reticle or mask, onto the surface of a semiconductor wafer). For example, in such devices, a subfield-selection deflector is used to direct an electron beam onto a mask subfield (among multiple subfields comprising the complete mask pattern) to be transferred to the wafer surface. In addition, in such devices, deflectors are used to guide the electron beam, after having passed through a mask subfield, to the corresponding region on the wafer substrate.

The most recent generation of deflectors for uses such as described above are so-called electrostatic deflectors, which are able to deflect electron beams or ion beams at high speeds and with high precision. Electrostatic deflectors can be used in place of electromagnetic deflectors or in addition to electromagnetic deflectors in a device.

FIG. 5 shows an example of a conventional hexapole electrostatic deflector in which six longitudinally extended electrodes 9A–9F are arranged equilaterally around an axis AX of an electron optical system (not shown). Each of the electrodes 9A–9F is defined by a respective conductive body shaped as longitudinal segment of a hollow cylinder extending along the light axis AX. During operation, variable voltages, for example, of opposing polarities are impressed on each opposing pair of electrodes (e.g., electrodes 9C and 9F). Selectively applying voltage to the electrodes in such a manner causes an electron beam EB, for example, passing longitudinally through the space surrounded by the electrodes 9A–9F to be deflected in the desired direction relative to the axis AX.

According to one prior-art method for making the type of electrostatic deflector shown in FIG. 5, a columnar or cylindrical member made from, e.g., a copper alloy sheet is fastened circumferentially with mounting screws to a cylindrical ceramic member. The sheet is then cut into respective multiple electrodes using cutters or the like. Unfortunately, electrodes made in this manner are thick and are thus prone to exhibit substantial eddy currents during use in a time-varying magnetic field. Such eddy currents prevent the electrodes, when used in an electromagnetic lens or electromagnetic deflector, from producing a sufficiently rapid switching or change in magnetic field.

According to another prior-art method for making an electrostatic deflector, especially such deflectors that are arranged inside electromagnetic lenses or electromagnetic deflectors, multiple electrodes are formed by partially coating the surface of an insulator with a metal. When making electrodes using this method, difficulty is frequently experienced in obtaining the required accurate angular orientation of the electrodes relative to each other in multiple-pole deflectors, for example.

SUMMARY OF THE INVENTION

The present invention provides solutions to the foregoing shortcomings in prior-art methods. Thus, a general object of the present invention is to provide improved methods for manufacturing electrostatic deflectors. Specific additional objects include (1) to provide methods for manufacturing such deflectors in which the electrodes are not prone to forming such eddy currents; and (2) to provide such methods by which multiple electrodes can be very accurately arranged in a desired angular relationship with one another in such deflectors.

Since, with this invention, multiple electrode-members are produced separately from an outer casing or other support member, multiple-pole electrode assemblies having, e.g., eight or more poles can be easily produced with high accuracy and precision.

In addition, by situating the electrode-members in a desired angular relationship prior to mounting the electrode-members to an outer casing to which the electrode-members will remain mounted during use, the electrode-members can be arranged relative to each other with high accuracy and precision in a desired angular relationship.

Furthermore, since the electrode-members are formed having surfaces that are at least partially coated with a conductive film, the amount of eddy current generated inside the electrode-members is slight, even when the electrode-members are situated inside a time-varying magnetic field. This makes high-speed modulation of a magnetic field possible.

According to a preferred embodiment, a method is provided for manufacturing an electrostatic deflector defining an interior space and being operable to deflect a charged particle beam passing through the interior space. The method comprises the steps of (a) providing multiple electrode-members formed of an electrically insulative material, each electrode-member having an outer surface; (b) providing an outer casing formed of an electrically insulative material, the outer casing having an inner surface; (c) coating at least a portion of the surface of each electrode-member, except the outer surface, with an electrically conductive film; and (d) attaching the outer surface of each electrode-member to the inner surface of the outer casing. The electrode-members can be differently sized and shaped relative to each other.

The foregoing and additional features and advantages of the present invention will be more readily apparent from the following detailed description, which proceeds with reference to the accompanying drawings.

DETAILED DESCRIPTION

Various aspects of methods according to the present invention for manufacturing an electrostatic deflector are illustrated in FIGS. 1–4. The subject deflector comprises an array of multiple electrode-members arranged preferably equilaterally around an axis and defining a void or space therebetween for passage of a charged particle beam. Also, the axis extends through the center of the space. As a charged particle beam propagates through the space, the deflector is operable to deflect the direction of propagation of the beam.

Figure 4:
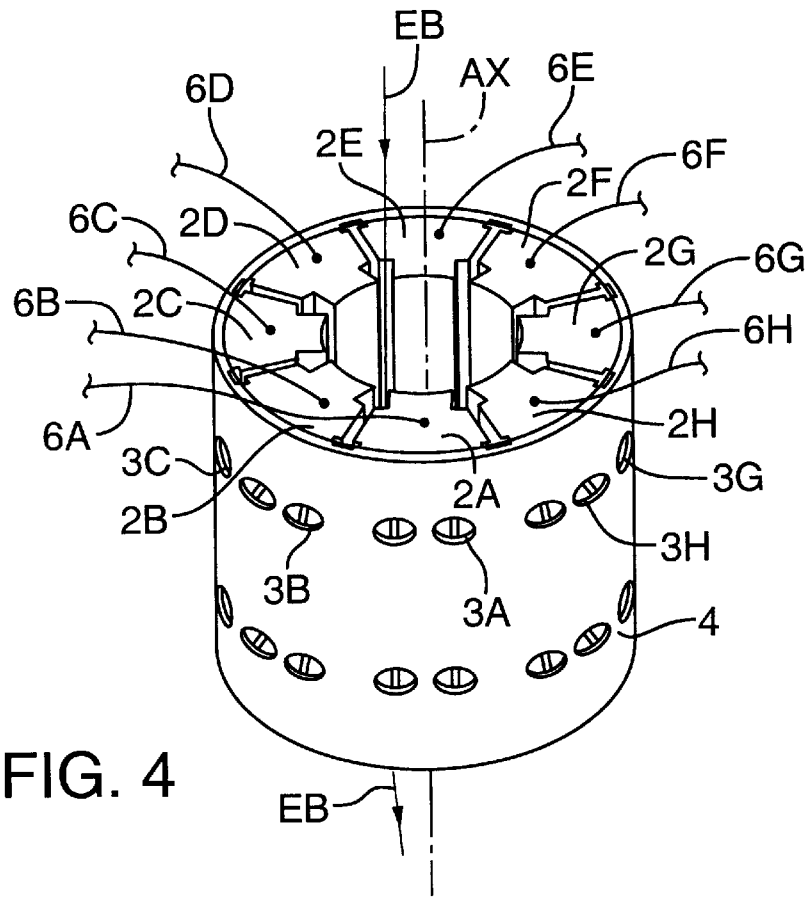
FIG. 4 is an oblique-view drawing showing the electrostatic deflector of FIG. 1 after the conclusion of a manufacturing process according to the present invention.
Figure 5:
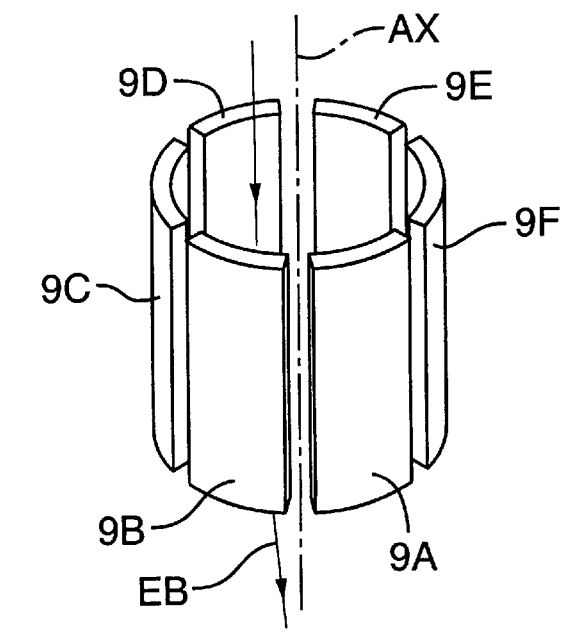
FIG. 5 is an oblique-view drawing of a prior-art electrostatic deflector.

A representative deflector assembly made according to the present invention and comprising plural electrode-members 2A–2H is shown in FIG. 4. The electrode-members 2A–2H are equilaterally arranged around the axis AX and define a space. The axis AX extends through the center of the space. During operation of the deflector, if a charged particle beam EB enters the space (in FIG. 4, the beam EB is shown entering the space parallel to the axis AX), the beam is deflected so as to change the direction of propagation of the beam.

The electrode-members 2A–2H are attached (e.g., by gluing, welding, use of separate fasteners such as screws, etc.) to the inner surface of an outer casing 4 formed of an electrically insulating material. Although FIG. 4 specifically depicts eight electrode-members, it will be understood that the actual number of electrode-members can vary depending on a number of factors. Generally, however, a deflector will have plural electrode-members.

Preferably, the electrode-members 2A–2H and the outer casing 4 are separately produced, then assembled together. The electrode-members 2A–2H can be individually produced with high precision. By fastening the electrode-members to the outer casing 4 according to the present methods, the entire deflector can be assembled with great precision, including the desired angular relationship of the electrode-members to each other in the deflector assembly.

The electrode-members 2A–2H are preferably fabricated of an electrically insulative material. An actual electrode on an electrode-member is formed by selectively coating a surface (such as a surface that would face the space in the deflector assembly) of the electrode-member with a conductive film. The surface of each electrode-member that contacts the outer casing 4 upon assembly is preferably not conductively coated; this allows the inner surface of the outer casing 4 to be provided with, for example, a conductive antistatic coating.

FIGS. 1–4 illustrate various features of an electrostatic deflector assembly made according to the present method, and thus illustrate a representative embodiment of a manufacturing method according to the present invention. The embodiment of FIGS. 1–4 is intended to merely illustrate the best mode now known for practicing the invention. The scope of the invention is not, however, to be considered limited to that embodiment.

Figure 1:
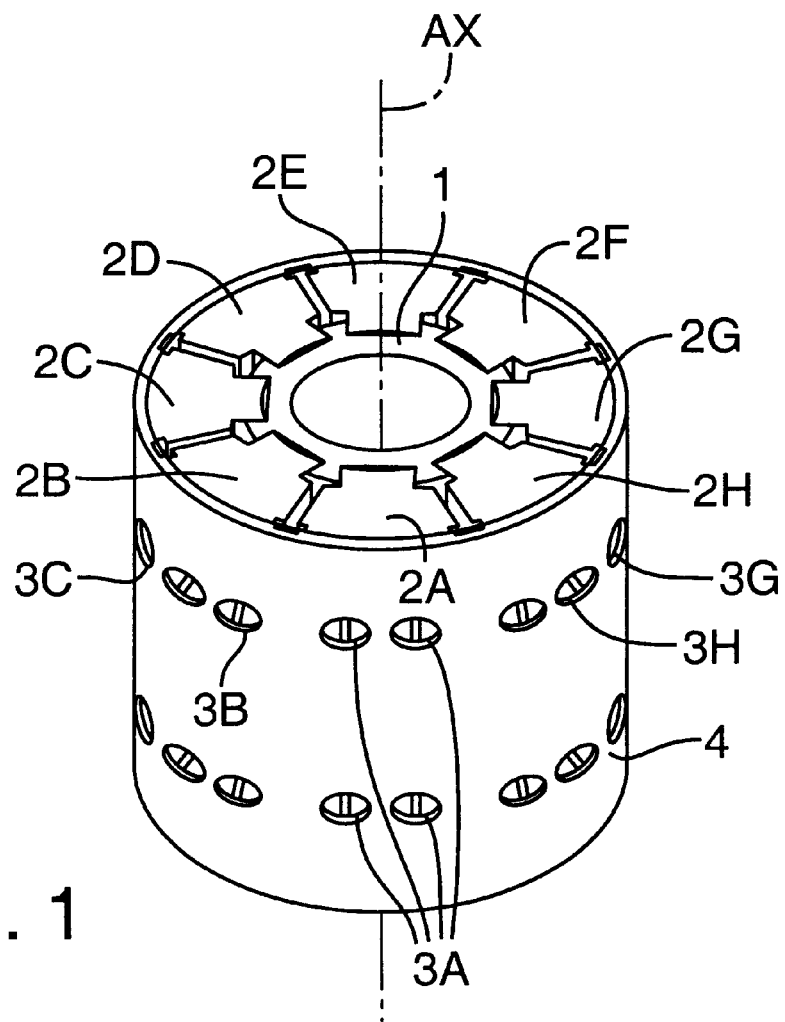
FIG. 1 is an oblique-view drawing showing a representative electrostatic deflector as it would appear during manufacture according to an example embodiment of a process according to the present invention.

Referring to FIG. 1 which shows a representative octapole electrostatic deflector as it would appear during manufacture, eight electrode-members 2A–2h are equilaterally situated around a central space defined in part by the arrangement of electrode-members and coaxial with an axis AX. Each electrode-member is attached to an outer casing 4. Situated in the space and longitudinally contacting each electrode-member is a jig 1.

Figure 2:
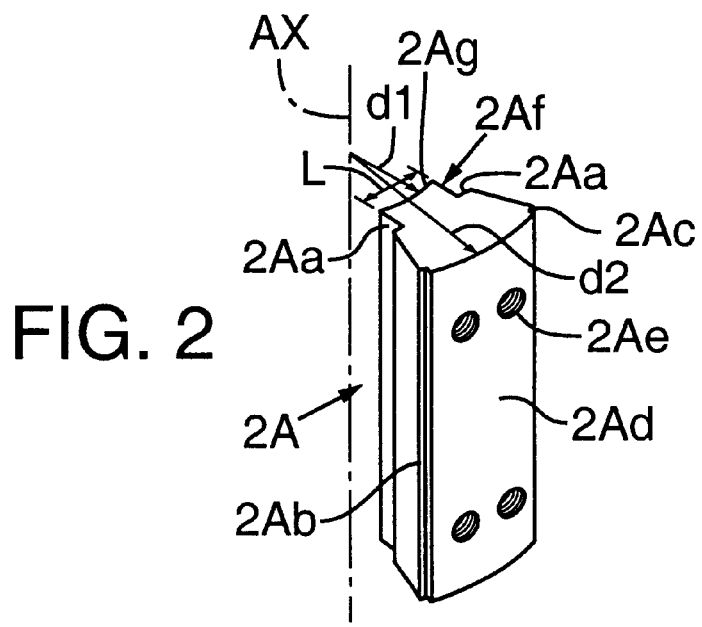
FIG. 2 is an oblique-view drawing showing a representative electrode-member usable in the electrostatic deflector shown in FIG. 1.

An exemplary electrode-member 2A is shown in FIG. 2. The electrode-member 2A is usually longitudinally extended axially as shown. The electrode-member defines a radially inwardly directed projection 2Af extending the length of the electrode-member. The projection 2Af is flanked by shoulders 2Aa having equal width. The projection 2Af has a nominal width L less a tolerance $\epsilon$ ($\epsilon$ is preferably several tens of $\mu$m). The projection 2Af also has an inner curved surface 2Ag facing the axis AX; the inner curved surface 2Ag preferably has an inner radius d1 as shown. The electrode-member 2A also has an outer curved surface 2Ad preferably having an outer radius d2 as shown, and laterally flanked by shoulders 2Ab, 2Ac.

Figure 3:
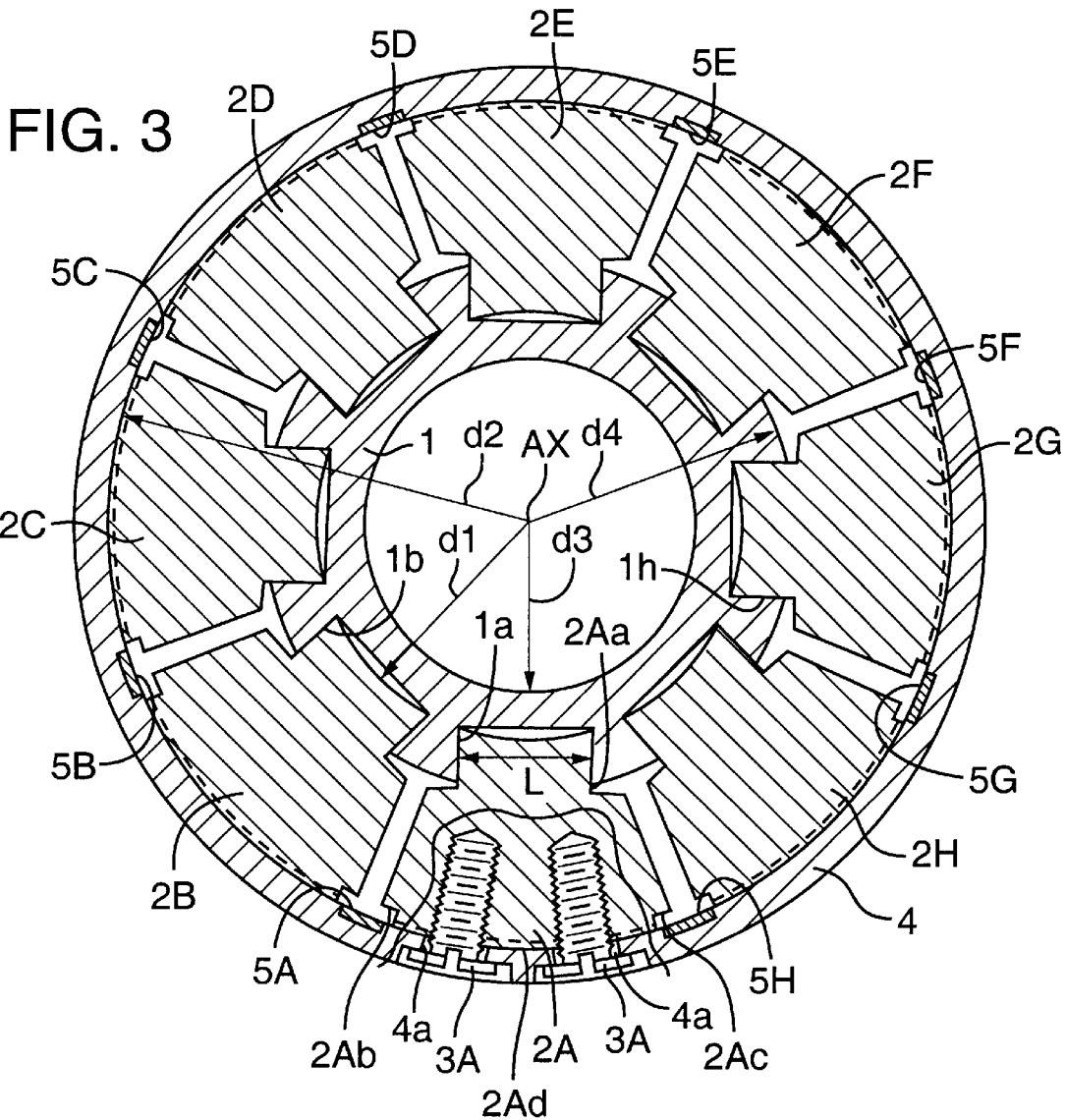
FIG. 3 is an enlarged lateral cross-section drawing of the electrostatic deflector of FIG. 1 with some of the mounting screws omitted.

The electrode-members 2A–2G are preferably made from an electrically insulative ceramic material. Cutouts defining the shoulders 2Aa are formed such as by cutting or molding, so as to form the projection 2Af having a width L–$\epsilon$. The shoulders 2Ab and 2Ac are also formed as shown. Preferably, a 50-nm thick titanium (Ti) film, and a 100-nm thick platinum (Pt) film, are deposited on the electrode-member, preferably by a sputtering technique, and preferably on all the electrode-member surfaces except the outer curved surface 2Ad and a part of 2Ab and 2Ac (FIG. 3). Each electrode-member can also be provided with threaded holes 2Ae on the outer curved surface 2Ad. Preferably, each electrode-member is provided with threaded holes 2Ae substantially as shown. The number of threaded holes is at least four in the depicted arrangement; if desired or if deemed necessary, a larger number of threaded holes can be used.

The outer casing 4 is preferably a hollow cylinder about the axis AX, with a desired wall thickness and an inner diameter of which the radius is preferably equal to d2. The outer casing 4 is preferably made of an electrically insulative material such as ceramic. For mounting each electrode-member, through holes (the number and relative spacing thereof corresponding to the number of threaded holes in each electrode-member) are defined by the outer casing 4. Preferably, each through hole 4a is counterbored (FIG. 3) to provide a seat for a screw (e.g., 3A), wherein the screws 3A–3H collectively attach the electrode-members 2A–2H to the outer casing 4 as shown. Thus, referring to FIG. 1, the outer casing 4 defines eight sets of four holes each, one set for each electrode-member.

As shown in FIG. 3, the jig 1 has an inner cylindrical surface having an inner radius d3 smaller than the radius d1 and an outer radius d4 larger than the radius d2. The jig 1 defines equilaterally spaced longitudinally extending (parallel to the axis AX) grooves 1a–1h around the circumference thereof, one for each electrode-member. The grooves 1a–1h each have a width (L+$\epsilon$) to allow a projection on an electrode-member to slip fit into the groove.

The jig 1 can be made of a suitable metal such as aluminum in which the grooves 1a–1h can be accurately machined or cut. Alternatively, the jig can be formed of a material normally having sufficient rigidity to support accurate forming of the grooves 1a–1h but that under certain conditions can be melted or dissolved away after assembly is completed.

Before assembly, the inside surface of the outer casing 4 preferably is coated with a 50-nm thick titanium film, superposed by a 100-nm thick platinum film to serve, inter alia, as an antistatic conductive coating. Such layers are usually formed by sputtering. With such a conductive coating on the inside surface of the outer casing, electrical insulation between adjacent electrode-members in an assembly such as that shown in FIG. 3 is maintained because, as described above, an electrically conductive coating is preferably not applied to the outer curved surface of each electrode-member or to a portion of the outer shoulder of each electrode-member. (The portions of the electrode-members that are preferably not conductively coated are indicated by the dashed lines in FIG. 3.) Alternatively, it is possible in an assembly such as shown in FIG. 3 for a conductive coating (titanium followed by platinum as described above) to be formed only in intermediate regions 5A–5H of the inner surface of the outer casing that would be situated between the electrode-members, as indicated in FIG. 3. This alternative approach allows the outer curved surface of each electrode-member to receive an antistatic conductive coating.

Not applying a conductive coating to the outer curved surface of each electrode-member 2A–2H preserves the insulative property between each electrode-member, even if all or part of the inner surface of the outer casing 4 is provided with an antistatic conductive coating. The same end is achieved if, on the inner surface of the outer casing, only the regions 5A–5H situated between adjacent electrode-members receive an antistatic conductive coating. With either approach, detrimental effects of unwanted static on a charged particle beam passing through the deflector assembly can be eliminated.

The mounting screws 3A–3H are preferably fabricated from a rigid electrically insulative material that can be threaded, such as a ceramic material. The screws 3A–3H can also be fabricated from a slightly conductive material. Either approach allows the electrode-members to be attached to the outer casing while still preserving the desired electrical insulation between the electrode-members.

For assembly, an electrode-member is mounted to the jig 1 by fully inserting the projection of the electrode-member in a corresponding groove in the jig as shown in FIG. 3. An electrode-member is inserted in such a manner into each groove of the jig. The assembly of jig and electrode-members has an outer diameter of which the radius is preferably slightly less than d2m. Thus, the assembly of jig and electrode-members can be axially inserted into the outer casing 4 in a slip-fit manner, and the electrode-members are attached to the inside surface of the outer casing using the screws 3A–3H.

Since the angular relationship of the grooves 1a–1h in the jig can be fabricated with a very high degree of isometric precision, the electrode-members 2A–2H can be arranged in the outer casing with a very high degree of isometric precision at the desired angular relationship with one another. Such a deflector assembly can deflect a charged particle beam, passing through the space defined by the array of electrode-members, with a high degree of accuracy and precision.

During assembly of the electrode-members 2A–2H to the jig 1, a lubricant can be applied to the longitudinal sides of the projections 2Af–2Hf, or to the sides of the grooves 1a–1h in the jig 1, to facilitate insertion. By forming the grooves 1a–1h deeply enough, the assembly of jig and electrode-members has an outer diameter of which the radius is slightly less than d2; this allows the assembly of jig and electrode-members to be inserted into the outer casing in a slip-fit manner. The through holes 4a–4h are then aligned with the corresponding threaded holes, and the each electrode-member is attached to the inside surface of the outer casing 4 using the screws inserted from the outside of the outer casing.

Because a lubricant preferably has been employed as described above, the shoulders 2Aa–2Ha of the electrode-members 2A–2H can easily slide along the respective groove 1a–1h in the jig 1 while the electrode-members are attached to the inner surface of the outer casing 4.

The FIG. 1 assembly is then preferably annealed by an appropriate heating and a subsequent cooling step in order to eliminate any residual warping. After annealing, the accuracy and precision of the angular relationship (i.e., isometric precision) of the electrode-members 2A–2H mounted in the outer casing 4 are measured. If the measurements fall outside specifications, the assembly can be disassembled and reassembled from the beginning as described above, then re-measured.

If the accuracy and precision measurements fall within specifications, respective lead wires 6A–6H (FIG. 4) are spot-welded to the ends of the electrode-members 2A–2H. Afterward, the FIG. 1 assembly is subjected to a treatment for removing the jig 1. For example, if the jig 1 is made of a meltable material, the FIG. 1 assembly is subjected to a condition in which the jig 1 is melted away. Alternatively, if the jig 1 is made of a soluble material (such as an acid-soluble metal), the FIG. 1 assembly is subjected to a solubilizing condition. An example of a solubilizing condition is immersion of the assembly with lead wires attached in a suitable acid (e.g., phosphoric acid for dissolving a jig made of aluminum). Removal of the jig 1 completes the assembly process.

The completed deflector assembly is illustrated in FIG. 4, wherein the outer casing 4 is situated coaxially with the "optical axis" AX of the deflector assembly. During use, the conductive film coating on the inner surface of the outer casing 4 (including instances in which such a film is applied only to the boundary areas 5A–5H) is electrically grounded. Variably controlled voltages are selectively applied to the conductive films on the surfaces of the eight electrode-members 2A–2H via the corresponding lead wires 6A–6H. Thus, a charged particle beam (such as an electron beam EB) passing through the interior space defined by the array of electrode-members is deflected in the desired direction.

The precision of the angular relationship of the electrode-members 2A–2H can be increased to a desired level by correspondingly tightening the fabrication tolerances of the jig 1.

Also, since the conductive film on the inner surface of the outer casing 4, or on the boundary areas 5A–5H, is electrically grounded, an insulating surface of the outer casing 4 is not presented to the beam EB passing through the interior space defined by the array of electrode-members. Furthermore, since the beam EB is shielded from the air through which it passes by the conductive film on the inner surface of the outer casing 4 being grounded, no adverse effects to the beam EB arise from any static charge on the outer casing 4.

In addition, since the thickness of the electrically conductive coating (e.g., 50-nm thick titanium layer superposed with a 100-nm thick platinum film) on some of the surfaces of the electrode-members 2A–2H, and on the inner surface of the outer casing 4, is extremely thin, any eddy currents generated in the conductive coating are slight, even if the deflector assembly is arranged inside a magnetic field of an electromagnetic lens or electromagnetic deflector. In fact, the deflector assembly experiences absolutely no effect upon changes in the magnetic field for, e.g., 10 $\mu$s; this allows the exteriorly situated electromagnetic lens or electromagnetic deflector to be modulated with high speed and stability.

In the deflector assemblies described and shown above, there are eight electrode-members 2A–2H. However, it will be understood that there can be any number of electrode poles in the assembly so long as there are generally multiple poles in the assembly.

Furthermore, although the electrode-members 2A–2H were described above as preferably being attached to the outer casing by screws 3A–3H, it will be understood that the electrode-members 2A–2H can alternatively be attached by an adhesive or by welding, or the like. Using screws provides a simple yet secure assembly, however.

Additionally, whereas the jig 1 described above is preferably dissolved away to complete the manufacturing process, it will be understood that the jig 1 simply can be removed by axially sliding the jig 1 from the assembly (so long as the dimensions L+ϵ and L−ϵ permit such sliding).

Further additionally, whereas the electrode-members are preferably collectively arranged in a cylindrical configuration as described above, it will be understood that the electrode-member can have any of various other spatial relationships to each other (e.g., a pair of plane-parallel plate electrode-members arranged facing each other, a pair of electrode-members arranged in a cylindrical shape on their sides, or further, electrode-members arranged in a square form, etc.)

Furthermore, when a jig is used made from a soluble material, with grooves formed in its perimeter for positioning the multiple electrode-members, and, after attaching the multiple electrode-members to the perimeter of the jig, and then attaching the outer casing to the perimeters of the multiple electrode-members, the jig can be removed by melting or dissolution. By fabricating the angular spacing of the grooves in the jig to a desired spacing with a high degree of precision, the desired angular relationship of the multiple electrode-members can be achieved in the deflector assembly with a high degree of precision.

Whereas the invention has been described in connection with a preferred and several alternative embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for manufacturing an electrostatic deflector for use in a time-varying magnetic field, the electrostatic deflector defining an interior space and being operable to deflect a charged particle beam passing through the interior space, the method comprising the steps:

(a) providing multiple electrode-members formed of an electrically insulative material, each electrode-member having an outer surface and a longitudinally extended projection;

(b) providing an outer casing formed of an electrically insulative material, the outer casing having an inner surface;

(c) selectively coating at least a portion of the outer surface of each electrode-member and of the inner surface of the outer casing with an electrically conductive film;

(d) providing a jig made of a rigid material, the jig having grooves each adapted to receive the projection of a respective electrode-member;

(e) arranging the electrode-members at a desired angular orientation relative to each other about an axis by situating the electrode-members in the jig so that the projections of the electrode-members are received within respective grooves of the jig;

(f) while maintaining the angular orientation of the electrode-members with the jig, attaching the outer surface of each electrode-member to the inner surface of the outer casing so that the coated portion of each electrode-member does not contact the coated portion of the inner surface of the outer casing, and wherein at least a part of the coated portion of the surface of each electrode-member is exposed to the interior space; and (g) removing the jig.

2. The method of claim 1, wherein the jig is made of a soluble material and the step of removing the jig comprises dissolving the jig.

3. The method of claim 1, further comprising, applying a lubricant to facilitate insertion of the projection of each electrode-member into the respective groove of the jig.

4. An electrostatic deflector formed by the method of claim 1.

5. The method of claim 1, wherein the jig is made of a meltable material and the step of removing the jig comprises melting the jig.

6. The method of claim 1, wherein the coated portion of the outer surface of each electrode-member is exposed to the interior space and the coated portion of the inner surface of the outer casing is exposed to the interior space.

7. The method of claim 1, wherein only the coated portion of the outer surface of each electrode-member and only the coated portion of the inner surface of the outer casing conductive are exposed to the interior space.

8. The method of claim 1, wherein the jig is a single item.

9. The method of claim 1, further comprising, after step (f), annealing the deflector.

10. A method for manufacturing an electrostatic deflector for use in a time-varying magnetic field, the electrostatic deflector defining an interior space and being operable to deflect a charged particle beam passing through the interior space, the method comprising the steps:

(a) providing multiple electrode-members formed of an electrically insulative material, each electrode-member having an outer surface and a longitudinally extended projection;

(b) providing an outer casing formed of an electrically insulative material, the outer casing having an inner surface;

(c) selectively coating at least a portion of the outer surface of each electrode-member and of the inner surface of the outer casing with an electrically conductive film;

(d) arranging the electrode-members at a desired angular orientation relative to each other by mounting the electrode-members to a jig made of a rigid but soluble material, the jig defining grooves each adapted to receive the projection of a respective electrode-member, wherein the projections of the electrode-members are received in respective grooves;

(e) while maintaining the angular orientation of the electrode-members, attaching the outer surface of each electrode-member to the inner surface of the outer casing using mounting screws inserted from the outside of the casing so that the coated portion of each electrode-member does not contact the coated portion of the inner surface of the outer casing, the mounting screws being selected to preserve a predetermined electrical insulation between the electrode-members and the outer casing; and (f) after step (e), removing the jig.

11. The method of claim 10, wherein the multiple electrode-members include plane-parallel plates.

12. The method of claim 10, wherein the electrically conductive coating of step (c) comprises a platinum film superposed on a titanium film.

13. The method of claim 12, wherein, in step (c), the electrically conductive coating has a thickness of less than about 100 nm.

14. The method of claim 10, wherein only the coated portion of the outer surface of each electrode-member and only the coated portion of the inner surface of the outer casing conductive are exposed to the interior space.

15. The method of claim 10, further comprising:
   measuring an angular orientation of at least one electrode-member;
   comparing the measured angular orientation to a predetermined specification for the angular orientation;
   disassembling the deflector if the measured angular orientation does not satisfy the predetermined specification; and
   reassembling the deflector.

16. A method for manufacturing an electrostatic deflector for use in a time-varying magnetic field, the electrostatic deflector defining an interior space and being operable to deflect a charged particle beam passing through the interior space, the method comprising the steps:

(a) providing multiple electrode-members formed of an electrically insulative material, each electrode-member having an outer surface and a longitudinally extended projection;

(b) providing an outer casing formed of an electrically insulative material, the outer casing having an inner surface;

(c) selectively coating at least a portion of the outer surface of each electrode-member and of the inner surface of the outer casing with an electricallyconductive film;

(d) arranging the electrode-members at a desired angular orientation relative to each other by mounting the electrode-members to a jig made of a rigid but meltable material, the jig defining grooves each adapted to receive the projection of a respective electrode-member, wherein the projections of the electrode-members are received in respective grooves;

(e) while maintaining the angular orientation of the electrode-members, attaching the outer surface of each electrode-member to the inner surface of the outer casing using mounting screws inserted from the outside of the casing so that the coated portion of each electrode-member does not contact the coated portion of the inner surface of the outer casing, the mounting screws being selected to preserve a predetermined electrical insulation between the electrode-members and the outer casing; and (f) after step (e), removing the jig.

* * * * *

UNITED STATES PATENT AND TRADEMARK OFFICE
CERTIFICATE OF CORRECTION

PATENT NO. : 6,125,522
DATED : October 3, 2000
INVENTOR(S) : Mamoru Nakasuji

It is certified that error appears in the above-identified patent and that said Letters Patent is hereby corrected as shown below:

Column 3,
Line 60, change "2A-2h" to -- 2A-2H --.

Column 5,
Line 62, change "the each" to -- then each --.

Column 7,
Line 23, change "etc.)" to -- etc.). --

Signed and Sealed this

Twenty-third Day of October, 2001

Attest:

*Nicholas P. Godici*

NICHOLAS P. GODICI
*Attesting Officer*   *Acting Director of the United States Patent and Trademark Office*